(12) United States Patent
Ahmed et al.

(10) Patent No.: US 9,203,348 B2
(45) Date of Patent: *Dec. 1, 2015

(54) ADJUSTABLE POWER SPLITTERS AND CORRESPONDING METHODS AND APPARATUS

(71) Applicant: FREESCALE SEMICONDUCTOR, INC., Austin, TX (US)

(72) Inventors: Abdulrhman M. S. Ahmed, Gilbert, AZ (US); Joseph Staudinger, Gilbert, AZ (US); Paul R. Hart, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/086,520

(22) Filed: Nov. 21, 2013

(65) Prior Publication Data

US 2014/0077874 A1 Mar. 20, 2014

Related U.S. Application Data

(63) Continuation-in-part of application No. 13/959,254, filed on Aug. 5, 2013, now Pat. No. 8,736,347, which is a continuation of application No. 13/360,473, filed on Jan. 27, 2012, now Pat. No. 8,514,007.

(51) Int. Cl.
*G06G 7/12* (2006.01)
*H03F 1/02* (2006.01)
(Continued)

(52) U.S. Cl.
CPC .............. *H03F 1/0288* (2013.01); *H03F 3/189* (2013.01); *H03F 3/20* (2013.01); *H03F 3/211* (2013.01); *H03F 3/602* (2013.01); *H03F 3/68* (2013.01)

(58) Field of Classification Search
CPC .................................. H01Q 3/26; H01Q 3/40
USPC ......................................................... 327/355
See application file for complete search history.

(56) References Cited

U.S. PATENT DOCUMENTS 2,210,028 A 8/1940 Doherty et al.
3,613,028 A 10/1971 Seidel
(Continued)

FOREIGN PATENT DOCUMENTS

EP 0966097 A1 12/1999
EP 1076412 A2 2/2001
(Continued)

OTHER PUBLICATIONS

U.S. Appl. No. 14/287,139, Ahmed, A.M.S., Office Action—Rejection, dated Oct. 9, 2014, pp. 1-22.
(Continued)

*Primary Examiner* — William Hernandez
(74) *Attorney, Agent, or Firm* — Sherry W. Schumm

(57) ABSTRACT

An adjustable power splitter includes: a power divider with an input and a plurality, N, of divider outputs; a plurality, N, of adjustable phase shifters and a plurality, N, of adjustable attenuators series coupled to the divider outputs and providing a plurality, N, of power outputs; an interface; and a controller. The controller is configured to receive, via the interface, data indicating phase shifts to be applied by the adjustable phase shifters and attenuation levels to be applied by the adjustable attenuators, and to control, based on the data, the phase shifts and attenuation levels applied by the adjustable phase shifters and the adjustable attenuators.

24 Claims, 8 Drawing Sheets

(51) Int. Cl.
*H03F 3/68* (2006.01)
*H03F 3/189* (2006.01)
*H03F 3/20* (2006.01)
*H03F 3/21* (2006.01)
*H03F 3/60* (2006.01)

(56) References Cited

U.S. PATENT DOCUMENTS

| | | |
|---|---|---|
| 3,671,885 A | 6/1972 | Pennypacker |
| 3,982,244 A | 9/1976 | Ward et al. |
| 4,002,971 A | 1/1977 | Rast, Jr. et al. |
| 4,048,568 A | 9/1977 | Rast, Jr. et al. |
| 4,477,781 A * | 10/1984 | Reuss, Jr. .................. 330/286 |
| 4,792,805 A | 12/1988 | Miglia |
| 4,975,604 A | 12/1990 | Barta |
| 4,987,378 A | 1/1991 | Eggleston et al. |
| 5,015,965 A | 5/1991 | Katz et al. |
| 5,148,062 A | 9/1992 | Goldfarb |
| 5,317,288 A | 5/1994 | Yung et al. |
| 5,349,364 A * | 9/1994 | Bryanos et al. ............ 343/853 |
| 5,444,418 A | 8/1995 | Mitzlaff |
| 5,469,129 A | 11/1995 | Dydyk |
| 5,576,660 A | 11/1996 | Pouysegur et al. |
| 5,594,385 A | 1/1997 | Anvari |
| 5,884,143 A | 3/1999 | Wolkstein et al. |
| 5,929,804 A | 7/1999 | Jones et al. |
| 5,969,572 A | 10/1999 | Jeong et al. |
| 5,986,500 A | 11/1999 | Park et al. |
| 6,006,111 A | 12/1999 | Rowland |
| 6,041,077 A | 3/2000 | Clark et al. |
| 6,070,090 A * | 5/2000 | Feuerstein .................. 455/561 |
| 6,111,462 A | 8/2000 | Mucenieks et al. |
| 6,208,204 B1 | 3/2001 | Suzuki et al. |
| 6,236,286 B1 | 5/2001 | Hoffmann et al. |
| 6,255,908 B1 | 7/2001 | Ghannouchi et al. |
| 6,320,464 B1 | 11/2001 | Suzuki et al. |
| 6,356,149 B1 | 3/2002 | Stengel et al. |
| 6,515,544 B1 | 2/2003 | Suzuki et al. |
| 6,972,621 B2 | 12/2005 | Matsuyoshi et al. |
| 7,071,775 B2 | 7/2006 | Gailus et al. |
| 7,078,976 B2 | 7/2006 | Blednov |
| 7,098,859 B2 | 8/2006 | Shimawaki et al. |
| 7,129,778 B2 | 10/2006 | Robinson |
| 7,167,693 B2 | 1/2007 | Bachman, II et al. |
| 7,205,817 B1 | 4/2007 | Huang et al. |
| 7,239,218 B2 | 7/2007 | Nakamura |
| 7,402,821 B2 | 7/2008 | Bernhardt |
| 7,427,895 B1 | 9/2008 | Okubo et al. |
| 7,525,395 B2 | 4/2009 | Hwang et al. |
| 7,598,805 B2 | 10/2009 | Staudinger et al. |
| 7,626,455 B2 | 12/2009 | Ito et al. |
| 7,680,467 B2 | 3/2010 | Ishigami |
| 7,683,828 B2 | 3/2010 | Stagliano, Jr. et al. |
| 7,786,822 B2 | 8/2010 | Vice |
| 7,813,766 B1 | 10/2010 | Lam |
| 7,928,817 B2 | 4/2011 | Atsumo |
| 8,035,444 B2 | 10/2011 | Okubo |
| 8,195,118 B2 * | 6/2012 | Warnick ...................... 455/272 |
| 8,354,882 B2 | 1/2013 | Blednov |
| 8,493,143 B2 | 7/2013 | Khilia et al. |
| 8,514,007 B1 | 8/2013 | Ahmed et al. |
| 8,606,206 B1 * | 12/2013 | Lam et al. .................. 455/273 |
| 8,653,890 B1 | 2/2014 | Ahmed et al. |
| 8,674,746 B1 * | 3/2014 | Staudinger .................. 327/333 |
| 8,710,924 B2 | 4/2014 | van der Zanden et al. |
| 8,712,466 B2 * | 4/2014 | Martineau et al. ......... 455/550.1 |
| 8,736,347 B2 | 5/2014 | Ahmed et al. |
| 8,736,365 B2 | 5/2014 | Correa et al. |
| 8,816,767 B2 | 8/2014 | Ahmed et al. |
| 8,957,734 B2 | 2/2015 | Ahmed et al. |
| 8,988,165 B2 * | 3/2015 | Staudinger .................. 333/139 |
| 2006/0044060 A1 | 3/2006 | Shiikuma |
| 2007/0164237 A1 | 7/2007 | Bernhardt |
| 2008/0012756 A1 | 1/2008 | Stagliano et al. |
| 2008/0039024 A1 | 2/2008 | Ikeda et al. |
| 2008/0111622 A1 | 5/2008 | Sperlich et al. |
| 2008/0238544 A1 | 10/2008 | Morris et al. |
| 2009/0167434 A1 | 7/2009 | Elmala |
| 2009/0206928 A1 | 8/2009 | Bowles et al. |
| 2010/0013527 A1 | 1/2010 | Warnick |
| 2010/0026387 A1 | 2/2010 | Blednov |
| 2010/0156528 A1 | 6/2010 | Couchman et al. |
| 2010/0227599 A1 | 9/2010 | Vella-Coleiro et al. |
| 2011/0304439 A1 | 12/2011 | Panchalan et al. |
| 2012/0224653 A1 | 9/2012 | Lozhkin |
| 2012/0294387 A1 | 11/2012 | Ghannouchi et al. |
| 2013/0194017 A1 * | 8/2013 | Staudinger .................. 327/231 |
| 2013/0194023 A1 | 8/2013 | Ahmed et al. |
| 2013/0241640 A1 | 9/2013 | Lin et al. |
| 2013/0314143 A1 | 11/2013 | Ahmed et al. |
| 2014/0077874 A1 | 3/2014 | Ahmed et al. |
| 2014/0125409 A1 | 5/2014 | Ahmed et al. |
| 2014/0253248 A1 | 9/2014 | Ahmed et al. |

FOREIGN PATENT DOCUMENTS

| | | |
|---|---|---|
| EP | 2017956 A1 | 1/2009 |
| EP | 2093879 A1 | 8/2009 |
| EP | 2521257 A1 | 7/2012 |
| JP | 2003209447 A | 7/2003 |
| JP | 2005117599 A | 4/2005 |
| JP | 2010273212 A | 12/2010 |
| WO | 9400890 A1 | 1/1994 |
| WO | 2011060058 A1 | 5/2011 |
| WO | 2013006943 A1 | 1/2013 |

OTHER PUBLICATIONS

EP Application 13151802.9, Partial Search Report, dated Sep. 26, 2014, pp. 1-8.
EP Application 13151802.9 Search Report, dated Jan. 13, 2015, 13 pages.
Non-Final Rejection mailed Feb. 7, 2013 for U.S. Appl. No. 13/360,473, 7 pages.
Non-Final Rejection mailed Sep. 10, 2013 for U.S. Appl. No. 13/959,254, 10 pages.
Notice of Allowance mailed Jan. 7, 2014 for U.S. Appl. No. 13/959,254, 7 pages.
Notice of Allowance mailed Mar. 18, 2015 for U.S. Appl. No. 14/287,139, 8 pages.
Notice of Allowance mailed May 16, 2013 for U.S. Appl. No. 13/360,473, 9 pages.
Notice of Allowance mailed Apr. 28, 2015 for U.S. Appl. No. 14/287,139, 10 pages.
Chen, Jiashu et al., "Design and Analysis of a Stage-Scaled Distributed Power Amplifier," IEEE Transactions on Microwave Theory and Techniques, vol. 59, No. 5, pp. 1274-1283, May 2011.
Darraji, Ramzi et al., A Dual-Input Digitally Driven Doherty Amplifier Architecture for Performance Enhancement of Doherty Transmitters, IEEE Transactions on Microwave Theory and Techniques, vol. 59, No. 5, pp. 1284-1293, May 2011.
Hsu, Sen-Kuei et al., "A Novel Compact Forward-Wave Directional Coupler Design Using Periodical Patterned Ground Structure," IEEE Transactions on Microwave Theory and Techniques, vol. 59, No. 5, pp. 1249-1257, May 2011.
Lane, A.A. "GaAs MMIC Phase Shifters for Pahse Arrays;IEEE Colloquim on Solid State Components for Radar"; pp. 3/1-3/5; 1988.
Mortazy, Ebrahim et al., "Mode Coupling Between Substrate Integrated Waveguide and Coplanar Waveguide for Traveling-Wave Electrooptical Modulator," IEEE Transactions on Microwave Theory and Techniques, vol. 59, No. 5, pp. 1258-1264, May 2011.
Sazegar, Mohsen et al., "Low-Cost Phased-Array Antenna Using Compact Tunable Phase Shifters Based on Ferroelectric Ceramics," IEEE Transactions on Microwave Theory and Techniques, vol. 59, No. 5, pp. 1265-1273, May 2011.
Zawrotny, K. et al., "C-Band 4-Bit Phase Shifter MMIC"; Microwaves, Radar and Wireless Communications 2008; Mikon 2008 17th international conference; 4 pages.

(56) References Cited

OTHER PUBLICATIONS

Notice of Allowance mailed Oct. 29, 2013 for U.S. Appl. No. 13/653,155, 9 pages.
Notice of Allowance mailed Oct. 9, 2013 for U.S. Appl. No. 13/656,551, 10 pages.
Notice of Allowance mailed Apr. 16, 2014 for U.S. Appl. No. 14/152,081, 8 pages.
Notice of Allowance mailed Oct. 3, 2014 for U.S. Appl. No. 14/464,270, 8 pages.
Non-Final Office Action mailed Mar. 24, 2015 for U.S. Appl. No. 14/066,601, 7 pages.
Notice of Allowance mailed Nov. 20, 2014 for U.S. Appl. No. 13/360,119, 7 pages.
Non-Final Office Action mailed Dec. 23, 2013 for U.S. Appl. No. 13/360,119, 8 pages.
U.S. Appl. No. 14/066,601, filed Oct. 29, 2013, entitled "Adaptive Adjustment of Power Splitter".
Partial European Search Report mailed Mar. 15, 2015 for EP 141897014, 8 pages.
Final Rejection mailed Jul. 9, 2015 for U.S. Appl. No. 14/066,601, 4 pages.
Extended European Search Report mailed Sep. 14, 2015 for EP 141897014, 13 pages.

\* cited by examiner

ADJUSTABLE POWER SPLITTERS AND CORRESPONDING METHODS AND APPARATUS

CROSS-REFERENCE TO RELATED APPLICATION

This application is a continuation-in-part of co-pending of U.S. patent application Ser. No. 13/959,254, filed on Aug. 5, 2013, which is a continuation of U.S. Pat. No. 8,514,007, filed on Jan. 27, 2012.

FIELD OF THE INVENTION

This invention relates to power or signal splitters in general and more specifically to techniques and apparatus for adjustable power or signal splitting or dividing.

BACKGROUND OF THE INVENTION

Power splitters or signal splitters or dividers are known. They are used, as the name suggests, to divide or split a signal into two or more identical signals. Identical or nearly identical signals can be used in various systems where the same signal is processed in varying manners or the same manner with more than one resultant signal being used in some combination for some purpose. For example, if signals are subject to the same interferences or distortions a practitioner can start with identical signals and use differential processing and subtract the resultant signals to basically eliminate the common interferences. As another example, some amplifiers use or start with identical signals and process these signals in distinctly different manners and then combine the resultant signals in some fashion to provide the final amplified signal.

In many of these cases where identical signals are used to begin with, the relative phase of the resultant or resulting processed signals is critical for a successful combination. Practitioners have used a phase adjustment in one of the signal paths to attempt to address this problem.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 11 depicts in a simplified and representative form a plurality of series coupled signal adjustment circuits being used in an N-way power amplifier system in accordance with one or more alternate embodiments.

DETAILED DESCRIPTION

In overview, the present disclosure concerns adjustable power splitters and methods therein and uses thereof, e.g., adjustable radio frequency power splitters, and more specifically techniques and apparatus for independently adjusting the signals at each output of the adjustable power splitter so the adjustable power splitter is or can be arranged and constructed for use with a Doherty power amplifier and/or other types of power amplifiers (e.g., switched mode power amplifiers (SMPAs), envelope elimination and restoration (EER) amplifiers, linear amplifiers using a non-linear component, and so on). More particularly various inventive concepts and principles embodied in methods and apparatus corresponding to adjustable power splitters suitable for use in amplifiers or Doherty amplifiers for improved efficiency, etc. will be discussed and disclosed.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Figure 1:
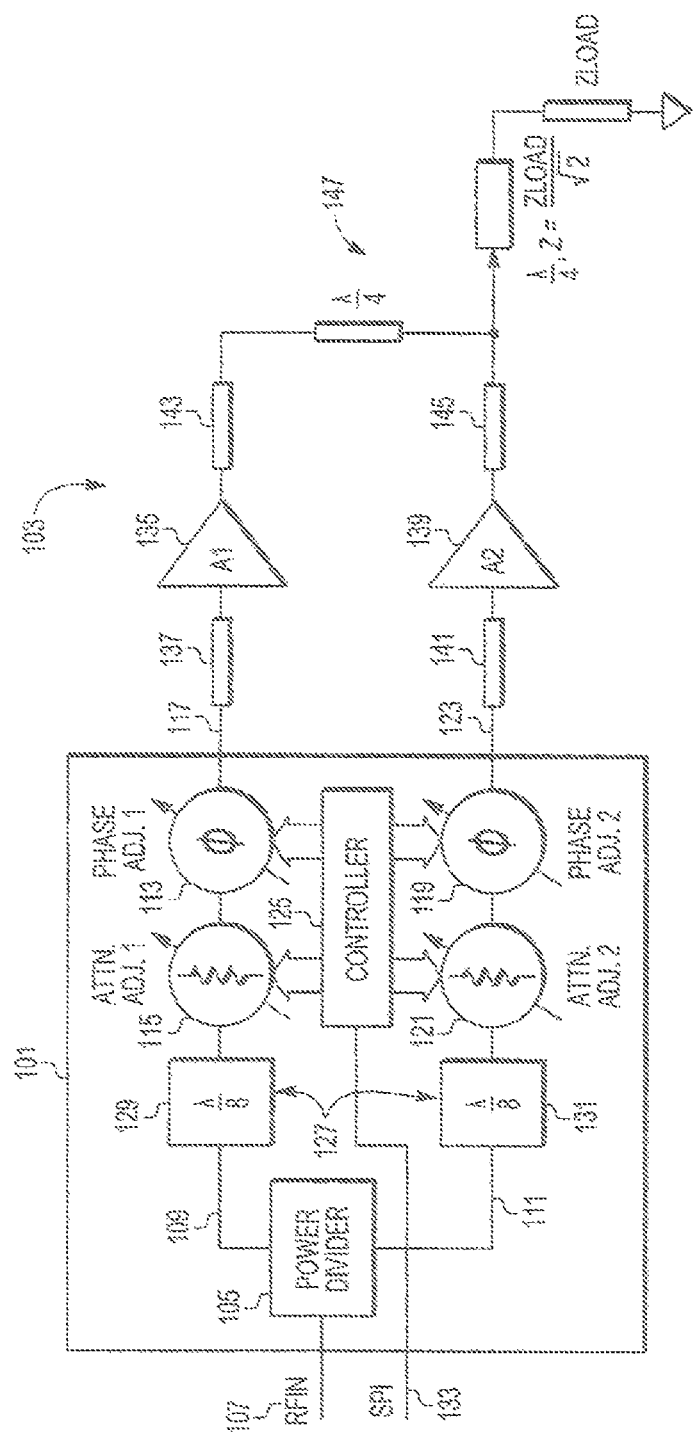
FIG. 1 depicts in a simplified and representative form an adjustable power splitter being used in a Doherty power amplifier system in accordance with one or more embodiments.

Referring to FIG. 1, a simplified and representative high level diagram of an adjustable power splitter utilized, e.g., in a Doherty power amplifier system in accordance with one or more embodiments will be briefly discussed and described. In FIG. 1 as shown, an adjustable power splitter 101 or radio frequency power splitter is coupled to or being utilized with or driving an amplifier, specifically a Doherty amplifier or Doherty power amplifier 103. It is to be understood that embodiments of adjustable power splitters alternatively may be coupled to or be utilized with other types of amplifiers, as well.

The adjustable power splitter 101 includes a power divider 105 with an input 107 and a first and second divider output 109, 111. The power divider 105 operates to divide or split a signal at the input 107 into two (or more in other embodiments—not specifically shown) signals, which are identical or very nearly identical signals with in some embodiments equal power. This equal power form of power divider is often referred to as a 3 decibel (dB) divider since the resultant signals are each 3 dB less than the signal at the input. While the 3 dB divider is typical, other dividers with multiple outputs or outputs with unequal signals could be fashioned and used in some applications. One or more embodiments of the power divider can be a lumped element circuit including an inductive and a capacitive reactance as will be further discussed below with reference to FIG. 2

Further included in the adjustable radio frequency power splitter 101, as shown in FIG. 1, is a first adjustable phase shifter 113 and in some embodiments a first adjustable attenuator 115, which are series coupled to the first divider output 109 and configured for providing a first power output 117. It will be appreciated that the adjustable phase shifter and adjustable attenuator can be series coupled to each other in any order, i.e., attenuator followed by phase shifter as shown or vice versa. Further included in the adjustable radio frequency power splitter 101 is a second adjustable phase shifter 119 and in some embodiments a second adjustable attenuator 121, which are series coupled to the second divider output 111 and configured for providing a second power output 123. As noted above the order in which these are series coupled to each other can be changed. As will be discussed in more detail in conjunction with FIG. 10, other embodiments may include additional phase shifters and/or attenuators that are series coupled to additional divider outputs.

In various embodiments of the adjustable power splitter 101, the first and typically the second adjustable phase shifter 113, 119 are each digitally controlled, e.g., by controller 125 and have a plurality of states. In one or more embodiments, the first adjustable phase shifter 113 and often the second adjustable phase shifter 119, each have eight phase shifted states. It will be appreciated that the first and second phase shifter may have different phase shifted states, cover different ranges, and have different steps sizes, although typically they will be essentially the same. While digitally controlled, the adjustable phase shifters in many embodiments are analog phase shifters. One or more embodiments of the adjustable phase shifters 113, 119 will be discussed below with reference to FIG. 4.

In various embodiments of the adjustable power splitter 101, the first and typically the second adjustable attenuator 115, 121 are each digitally controlled, e.g., by controller 125 and have a plurality of states. In one or more embodiments, the first adjustable attenuator 115 and often the second adjustable attenuator 121, each have eight attenuation states or attenuation levels. It will be appreciated that the first and second attenuation may have different attenuation states, cover different attenuation ranges, and have different attenuation steps sizes, although typically they will be essentially the same. While digitally controlled, the adjustable attenuators in many embodiments are analog attenuators. One or more embodiments of the adjustable attenuators 115, 121 will be discussed below with reference to FIG. 3.

Some embodiments of the adjustable power splitter 101 further include a fixed phase shifter 127 that is configured for adding a fixed phase shift between first and second signals at the, respective, first and second power outputs 117, 123. In some embodiments this can be a fixed and predetermined phase shift, e.g., 90 degrees, added to one signal path, i.e., path between output 109 and power output 117 or path between output 111 and power output 123. In certain applications, e.g., Doherty amplifier 103, a ninety degree phase shift is added to one path in the amplifier and the fixed phase shift can be used to offset this amplifier phase shift. The fixed phase shift in some embodiments is a phase shift in a direction (negative or positive), e.g., a negative shift λ/8 129, such as a negative forty five degree shift, for the first signal at the first power output 117 and a phase shift in the opposite direction, e.g., a positive shift λ/8 131 such as a positive forty five degree phase shift for the second signal at the second power output 123. Using the forty five degree shifts gives a ninety degree phase shift between the signals at the power outputs 117, 123. The phase shifter 127 or negative shift 129 and positive shift 131 can be lumped element circuits having an inductive and a capacitive reactance as will be further discussed below with reference to FIG. 2.

As suggested above, the adjustable power splitter 101 typically further comprises the controller 125 which is configured and arranged to control or for controlling the adjustable phase shifters and adjustable attenuators. The controller 125 can be provided data via an interface 133, such as a serial interface and in some embodiments this is a serial peripheral interface (SPI), which as is known typically includes a data in and out, clock signal, and chip select lines. The interface (e.g., the SPI) may be implemented on the same integrated circuit chip as the power splitter 101 (e.g., a single silicon or gallium-arsenide chip), or the interface and the power splitter 101 may be implemented on different integrated circuit chips (e.g., two silicon chips, two gallium-arsenide chips, or a combination of one silicon chip (e.g., for the SPI) and one gallium-arsenide chip (e.g., for the power splitter 101)). In addition, the power divider 105, the fixed phase shifters 127, the controller 125, the adjustable phase shifters 113, 119, and the adjustable attenuators 115, 121 may be implemented on the same integrated circuit chip, or may be implemented on two or more integrated circuit chips. In still other alternate embodiments, some of these components may be implemented on the printed circuit board level, while other components are implemented in packaged devices.

Various approaches and variants or combinations of those approaches can be utilized by the controller. Generally as will be explained below, control of the attenuators or phase shifters amounts to controlling switches, typically solid state or integrated switches such as some form of field effect transistor switch or bipolar junction transistor switch. Thus the controller can be provided state information for all switches in all attenuators and phase shifters and essentially act as one or more latching buffers with outputs arranged and coupled to ensure that all switches are in the appropriate ON or OFF state. Alternatively, the controller can be provided in essence an address or two or more addresses, which address(es) uniquely specify a state for each attenuator and phase shifter. For example if all phase shifters and attenuators are 8 state devices a 3 bit address for each would uniquely specify the proper state and 4 such addresses could be provided to the controller, which would convert each address to the appropriate control signals for each attenuator and phase shifter and latch in these values, etc. In other embodiments the amount of phase shift and attenuation for each of the four devices could be sent to the controller and it could determine the proper state to realize the desired shifts and attenuations. The practitioner is free to choose from among these or other approaches or combinations to make and retain the appropriate adjustments to the adjustable attenuators and adjustable phase shifters.

In addition to the adjustable power splitter 101, the radio frequency Doherty power amplifier 103 is shown where this amplifier includes a main amplifier 135 coupled via a matching network or circuit 137 to the first power output 117 and a peaking amplifier 139 coupled by its matching circuit 141 to the second power output 123. As will be appreciated by those of ordinary skill the main and peaking amplifiers are comprised of one or more stages of low level amplification and higher power level amplification. The main and peaking amplifiers are coupled via, respective, output matching circuits 143, 145 to a Doherty combiner 147, which as is known is configured such that the main amplifier provides the amplification for lower level signals and both amplifiers combine to provide the amplification for high level signals. This is usually accomplished by, e.g., biasing the main amplifier, such that is operates in a class AB mode and biasing the peaking amplifier such that it operates in a class C mode. The amplifiers 135, 139 may be implemented within the same package as the adjustable power splitter 101, or the amplifiers 135, 139 may be implemented in a separately packaged device. The amplifiers 135, 139 may, for example, be implemented on one or more integrated circuit chips, including one or more silicon, gallium-arsenide, gallium-nitride integrated circuit substrates, or other types of substrates.

Figure 10:
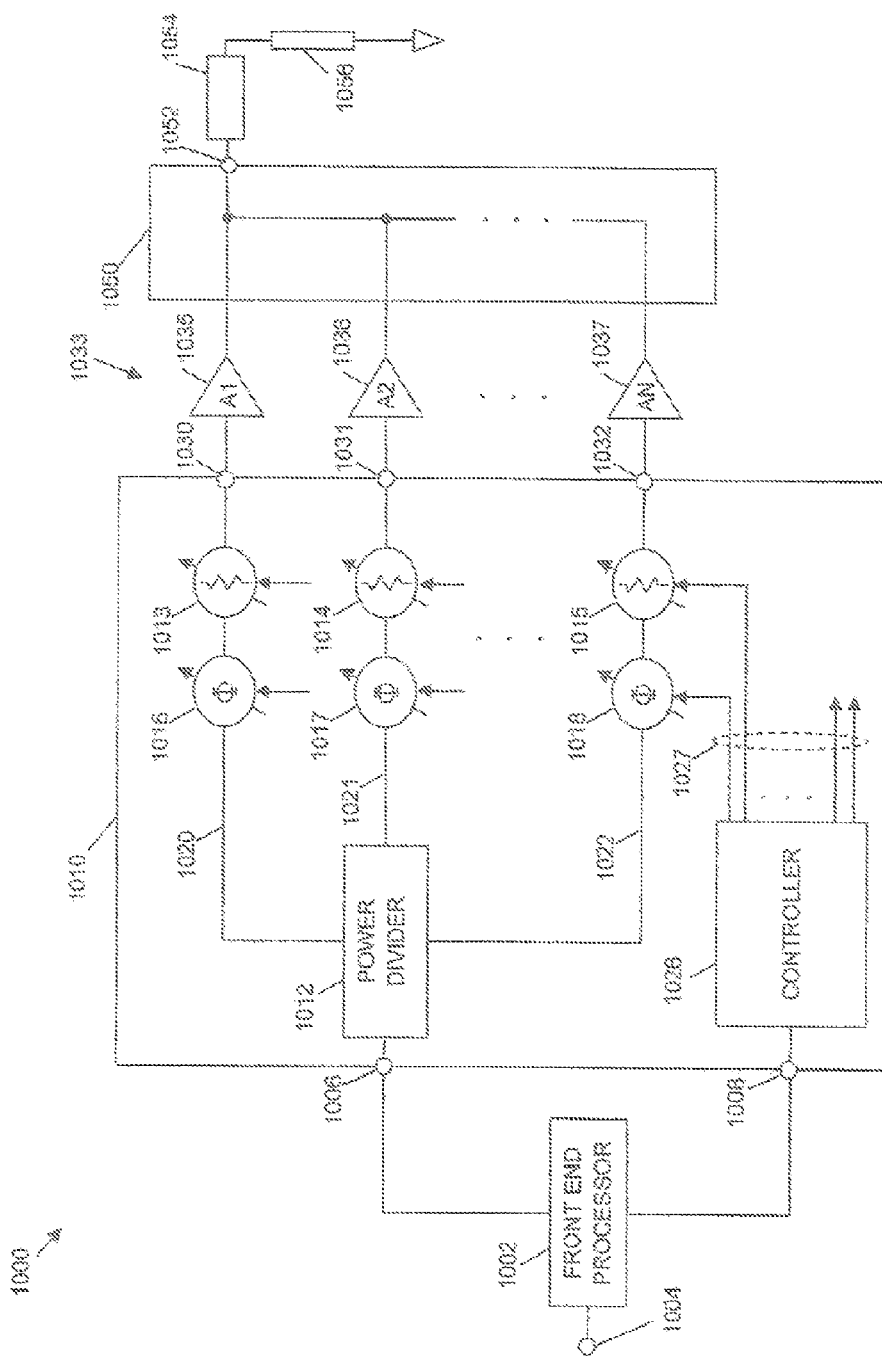
FIG. 10 depicts in a simplified and representative form an N-way power amplifier system that includes an adjustable power splitter in accordance with one or more embodiments.

More complex embodiments are possible, such as the embodiment illustrated in FIG. 10, where the adjustable power splitter has three or more outputs and the Doherty amplifier has a main and two or more peaking amplifiers with each peaking amplifier biased in different class C operating points. In one or more of these manners, overall efficiency/linearity of the amplifier can be improved over a wider range of signal levels. Adjustments to the adjustable attenuators and adjustable phase shifters can be made in an experimental manner by monitoring power drawn by the peaking stage or main stage or both as a function of signal levels and the like. At certain signal levels the peaking amplifier should begin to operate and amplitude and phase adjustments can be made with this in mind.

FIG. 1 illustrates additional features for the adjustable power splitter with a Doherty amplifier where these features have been discussed above or will be discussed below in further detail. For example, the first and second adjustable phase shifters and the first and second adjustable attenuators are digitally controlled with each having multiple states, e.g., 8 or more or less states. The power divider can be a lumped element circuit including one or more inductive reactance and capacitive reactance and other elements. The lumped element circuit can further include a first lumped element phase shifter configured to provide a negative forty five degree phase shift for a first signal at the first power output and a second lumped element phase shifter configured to provide a positive forty five degree phase shift for a second signal at the second power output. As noted earlier the adjustable power splitter with Doherty amplifier can also include or comprise a controller for controlling the adjustable phase shifters and adjustable attenuators.

Figure 2:
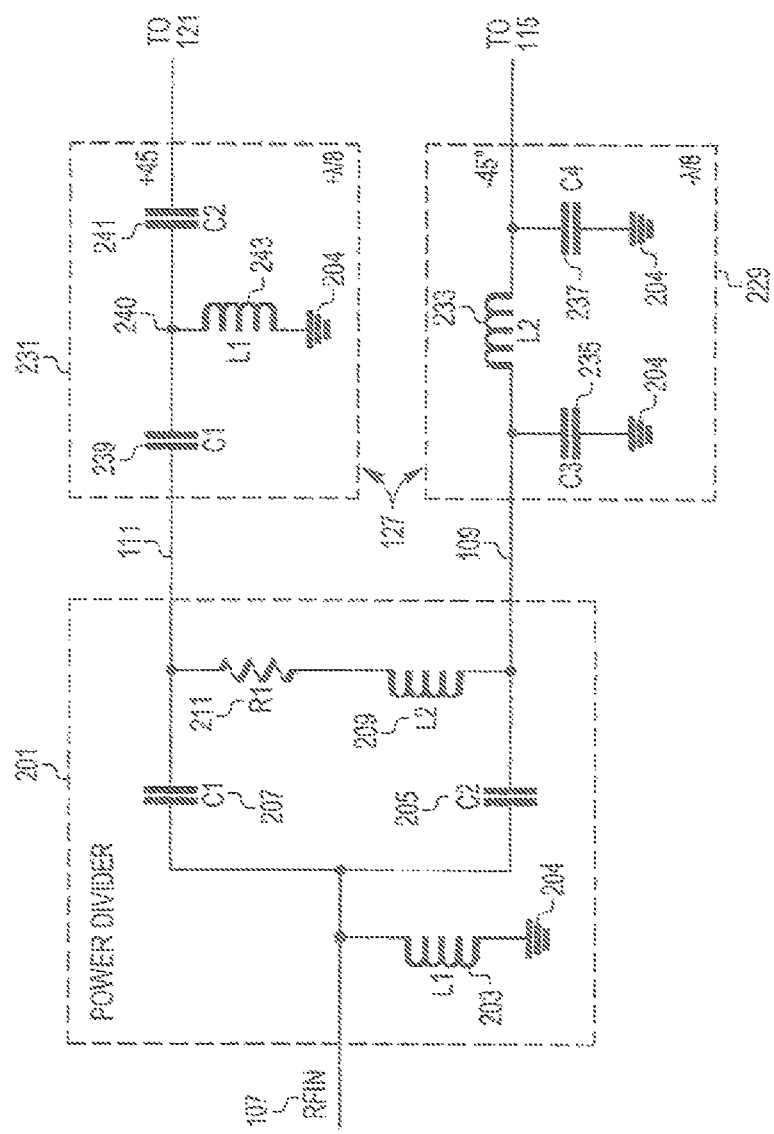
FIG. 2 in a representative form, shows a diagram of a power divider and fixed phase shifter in accordance with one or more embodiments, which is suitable for use in the FIG. 1 adjustable power splitter.

Referring to FIG. 2, a representative diagram of a power divider and fixed phase shifter(s) in accordance with one or more embodiments, which embodiments are suitable for use in the FIG. 1 adjustable power splitter, will be briefly discussed and described. In FIG. 2 and all ensuing FIGs. like reference numbers will designate like features from other FIGs. FIG. 2 illustrates an input or RF input 107 to a power divider 201 which has a first output or divider output 109 and a second output or divider output 111 (I/O numbered same as FIG. 1). The power divider as illustrated is implemented with one or more lumped element inductive reactances 203, 209 and one or more capacitive reactances 205, 207 as well as a resistive loss or resistor 211. As shown a shunt inductance 203 or inductor is coupled from the input to a reference node (ground) 204. This inductance will operate to reduce power in any low frequency signals at the input. Two series capacitances 205, 207 or capacitors 205, 207 are coupled from the input to, respectively, the first divider output 109 and the second divider output 111. These capacitances will typically be equal valued for a 3 dB splitter. A series coupled inductance 209 and resistance 211 is coupled between the first and second divider outputs and operates to balance the signal at these outputs. The actual values for the inductors and capacitors and resistor will vary in accordance with operating frequencies and operating impedances. Generally the shunt inductor 203 in combination with capacitor 207 forms a high pass structure which exhibits an impedance transformation between 107 (100 ohms for example) to 111 (50 ohms for example). Similarly, inductor 203 in combination with capacitor 205 forms a high pass structure which exhibits an impedance transformation between 107 (100 ohms for example) to 109 (50 ohms for example). Resistor 211 in combination with inductor 209 creates a 50 ohm (nominal) odd-mode impedance at nodes 111 and 109. The combination of the elements is such that nodes 107, 109, and 111 each exhibit an impedance of 50 ohms (for example) and the combination of elements can be further chosen such that and equal or unequal power is split from 107 to 111 and 107 to 109, respectively. One of ordinary skill can readily and experimentally determine the appropriate values for a given application. An alternative embodiment for the power splitter could use transmission lines although it is noted that these embodiments may not be as useful (e.g., much larger in physical size) over as broad of a bandwidth as the lumped element embodiments.

FIG. 2 also illustrates an embodiment of the fixed phase shifter in accordance with fixed phase shifter 127 and more specifically two fixed, but opposite direction phase shifters. One is a negative shift 229 such as a negative forty five degree shift that is coupled to divider output 109 and provides an output that goes to adjustable attenuator 115 (see FIG. 1). This negative shift 229 corresponds to negative shift 129 of FIG. 1. The negative shift 229 is a lumped element circuit having or implemented with an inductive reactance 233 coupled from divider output 109 to adjustable attenuator 115 and further having an input capacitive reactance 235 coupled from divider output 109 to a reference node (ground) 204 and an output capacitive reactance 237 or capacitor coupled from adjustable attenuator 115 input to the reference node 204. The specific values for the inductors and capacitors will depend on operating impedances and signal frequencies but can be experimentally determined by practitioners without undue experimentation.

The other fixed shift is a positive shift 231, such as a positive forty five degree shift that is coupled to divider output 111 and provides an output that goes to adjustable attenuator 121 (see FIG. 1). The positive shift 231 corresponds to the positive shift 131 of FIG. 1. The positive shift 231 is a lumped element circuit having an input capacitive reactance 239 coupled from divider output 111 to a common node 240 and an output capacitive reactance 241 or capacitor coupled from the common node 240 to adjustable attenuator 121 input. Further included is an inductive reactance 233 coupled from the common node 240 to the reference node (ground) 204. The specific values for the inductors and capacitors will depend on operating impedances and signal frequencies but can be experimentally determined by practitioners without undue experimentation. Although examples of fixed phase shifters 129, 131, 229, 231 have been described that apply negative and positive forty five degree shifts, respectively those of skill in the art would understand, based on the description herein, that fixed phase shifters 129, 131, 229, 231 may apply different phase shifts to achieve a desired phase difference between divider outputs 109, 111, and/or the fixed phase shifters 229, 231 may apply phase shifts to achieve a desired phase difference other than 90 degrees between divider outputs 109, 111. In still another alternate embodiment, all or substantially all of the desired phase difference may be achieved using phase shifts applied by adjustable phase shifters 113, 119. In such an embodiment, fixed phase shifters 129, 131, 229, 231 may be excluded from the system. In addition, although the embodiments of fixed phase shifters 229, 231 illustrated in FIG. 2 each include three passive components (i.e., two capacitors and one inductor, each), those of skill in the art would understand, based on the description herein, that alternate embodiments of fixed phase shifters may include more or fewer passive components (i.e., the number of inductors plus the number of capacitors may equal two or more (e.g., from 2 to 10 or more)). In still other embodiments, either or both of fixed phase shifters may consist of or include transmission lines of specific lengths that achieve the desired phase shifts.

Figure 3:
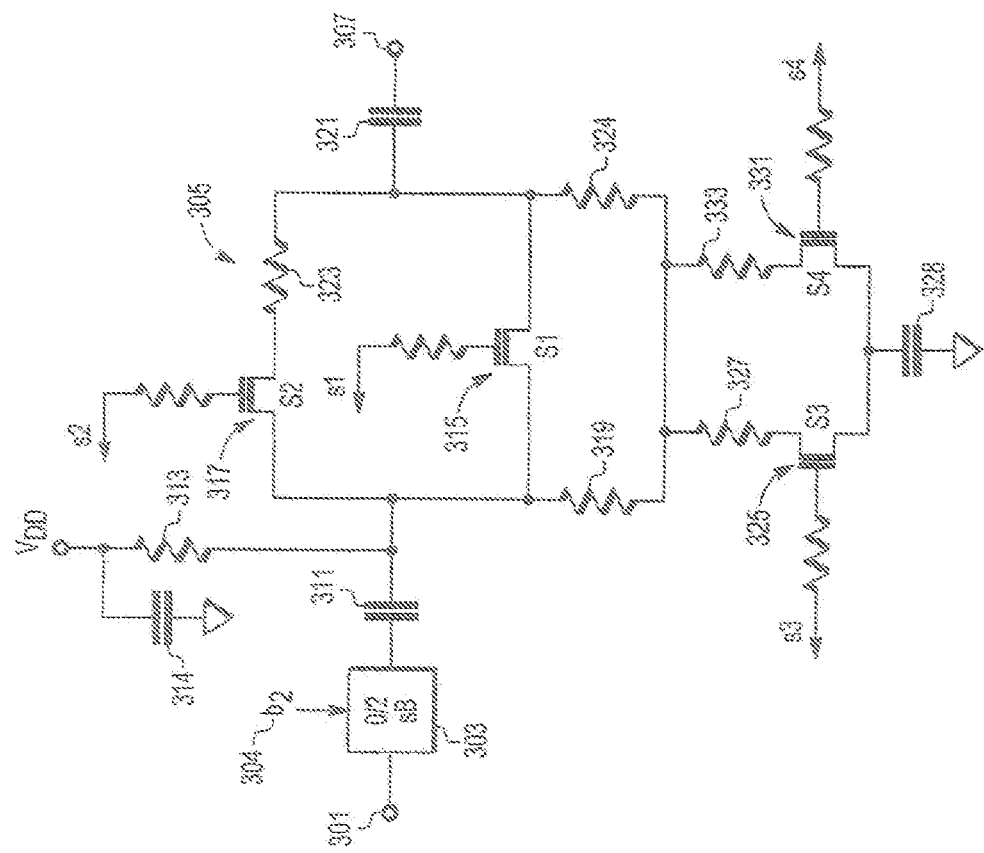
FIG. 3 depicts a representative diagram of an adjustable attenuator in accordance with one or more embodiments.

Referring to FIG. 3, a representative diagram of an adjustable attenuator in accordance with one or more embodiments will be discussed and described. FIG. 3 shows a representative embodiment of an adjustable attenuator suitable for use in the FIG. 1 adjustable power splitter. FIG. 3 illustrates an input 301 (analogous to input to adjustable attenuator 115 or 121 in FIG. 1) to a first variable attenuator 303, which provides either 0 db or 2 db of attenuation, where 2 dB is provided when b2 304 is high or equal to 1. The first variable attenuator is a resistive divider with a switch around the divider (not specifically shown). The control line b2 opens this switch. The first variable attenuator 303 is coupled to a second variable attenuator 305 which provides an attenuated signal at output 307 (analogous to input to 113, 119 in FIG. 1). The second variable attenuator is shown in more detail and is arranged and configured to provide 0 dB to 1.5 dB of attenuation in 0.5 dB steps, i.e., 0 dB, 0.5 dB, 1.0 dB, or 1.5 dB of attenuation where these steps or attenuations can be referred to as negative gains (e.g., −0.5 dB gain). Thus the serial combination of adjustable attenuator 303 and 307 can provide from 0 dB up to 3.5 dB of attenuation depending on control signal states, i.e., step through 0-1.5 dB with attenuator 305 and then bring in 2 dB with attenuator 303 and go through or repeat the steps, 0-3.5 dB, with attenuator 305.

Further shown in FIG. 3 is a table 309 of input signals b0, b1, and switch control signals s1-s4 which result from the input signals b0, b1 together with expected attenuation as a function of a particular combination of s1-s4. By observation s1 is the logical OR inverted (NOR) of b0, b1, i.e., high only when both inputs are low and low otherwise. Similarly s2 is the OR of b0, b1, i.e., high if either input is high. Further s3 is equal to b0 and s4 is the logical AND of b0, b1, i.e., high only if both inputs are high.

In more detail, the first adjustable attenuator 303 is coupled to a capacitance 311 which will have a near zero impedance for signals of interest and this capacitance is coupled to a resistor 313 which is a relatively high value and is used for biasing purposes. Supply noise is coupled to ground by capacitor 314. Capacitor 311 is further coupled to switch S1 315, switch S2 317, and resistor 319. When S1 is ON, (s1=1 or high) there will be near zero attenuation as the input signal at capacitor 311 will be coupled via S1 to the output capacitor 321 and thus output 307 since the output capacitor is near zero impedance for signals of interest (see also table, line 1). When S1 is OFF and S2 is ON (s1=0, s2=1 or high), the input signal at capacitor 311 will be coupled to resistor 323 and from there to the output capacitor 321. The input signal will also be coupled through the series combination of resistor 319 and 324 to the output capacitor 321. Resistors 323 in parallel with the series combination of resistors 319, 324 are chosen to provide an attenuation of 0.5 dB given the operating frequencies and impedances (see table, line 2). If, in addition to S2 being ON, switch S3 325 is ON (s3=1 or high), the signal at the node between resistors 319, 324 will be coupled via resistor 327 to capacitor 328 and thus ground. This will increase the attenuation and resistor 327 is selected such that an additional 0.5 dB or a total of 1.0 dB of attenuation is provided with this combination of switches (see table, line 3). If in addition to S2 and S3, switch S4 331 is ON (s4=1 or high) resistor 333 will be added in parallel with resistor 327 and the signal will be further attenuated. Resistor 333 is chosen to add a further 0.5 dB for a total of 1.5 dB of attenuation to the signal at the output (see table, line 4). Those of ordinary skill given a specific application with operating frequencies and impedances can determine the appropriate values of the resistors by calculation or experimentation. The switches 314, 317, 325, 331, and the switch referred to in conjunction with variable attenuator 303, etc. are controlled by a control circuit, e.g., controller 125 or another controller or latch, which can alternatively be viewed as a portion of the attenuator with selectable attenuation.

Figure 4:
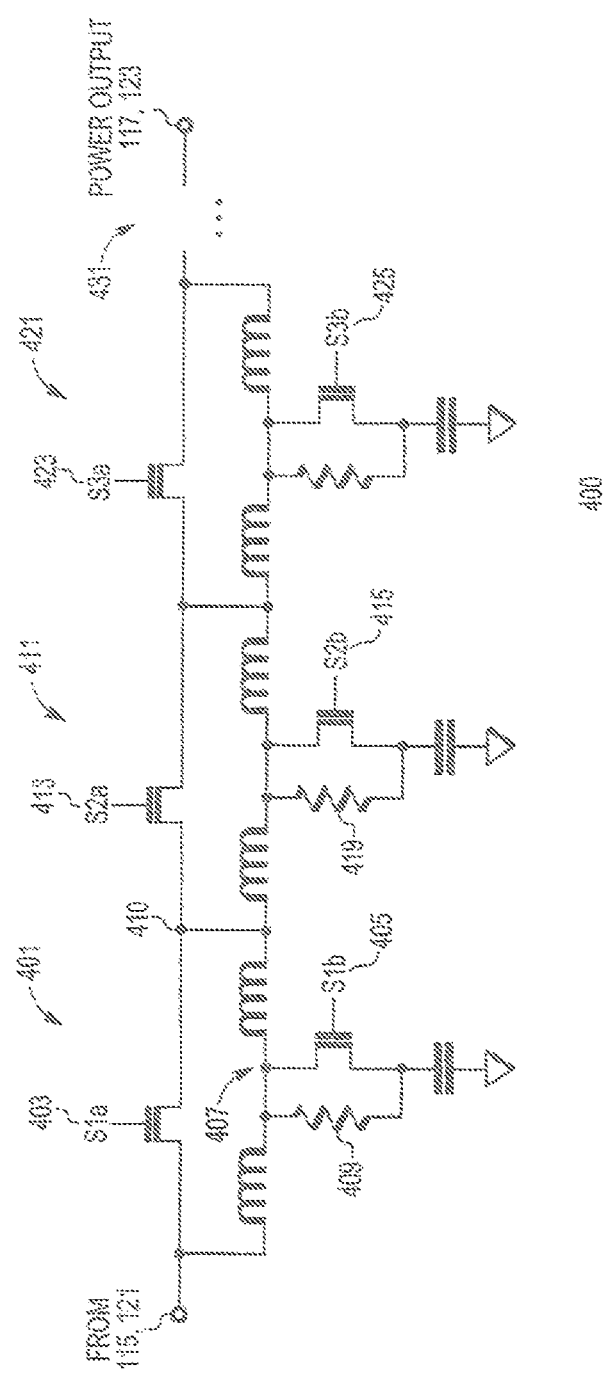
FIG. 4 depicts a representative diagram of an adjustable phase shifter in accordance with one or more embodiments.

Referring to FIG. 4, a representative diagram of an adjustable phase shifter in accordance with one or more embodiments will be discussed and described. The adjustable phase shifter illustrated in FIG. 4 is one embodiment of the subject matter of co-pending U.S. patent application Ser. No. 13/360, 119, filed on Jan. 27, 2012, which application is hereby incorporated herein by reference.

FIG. 4 illustrates a high level diagram of a phase shifter or delay line phase shifter with selectable phase shift in accordance with one or more embodiments. In FIG. 4, an adjustable phase shifter 400 with selectable or variable phase shift is shown in a representative manner. The phase shifter 400 has an input coming from adjustable attenuator 115 or 121 in FIG. 1 or a signal input for input signals, e.g., radio frequency (RF) signals and an output coupled to divider or divider power outputs 117, 123 or a signal output for phase shifted versions of the input signal, e.g., phase shifted versions of the RF signals. Between the input and output are one or more switchable phase shifting elements or circuits, including specifically phase shifting elements 401, 411, 421, and possibly additional phase shifting elements or circuits 431 serially coupled as shown.

Generally speaking in many embodiments and as will be further discussed and described below, the switches shown are provided with a pair of single throw switches a, b for each phase shifting element 401, 411, 421. Each of the phase shifting elements can be designed, arranged and configured to provide some predetermined amount of phase shift. If a practitioner needs to cover a certain range of phase shift and needs a certain resolution for the phase shift it can be advantageous to design the first or one of the phase shifting elements to provide a choice between nominally zero or a minimal phase shift and the smallest phase shift step one needs (i.e., the resolution) with the next or another phase shifting element configured to provide minimal or 2× the smallest step needed. Thus with two phase shifting elements you can provide a near zero, 1×, 2×, and 3× small step in phase shift by activating different combinations of the a, b switches. Adding another phase shifting element with a 4× shift, allows 8 states with corresponding 0 to 7× the small step and so on. The number of phase shifting elements will be determined by the required resolution (step size) and the phase range needed to be covered (number of steps). For example if you want to cover 49 degrees with a resolution of 7 degrees then 8 states, including 0 will be required and this can be accomplished with 3 phase shifting elements etc. etc.

In more detail, switchable phase shifting element or circuit 401 (and the other similar phase shifting elements) further comprises a first signal path coupled between the input through a switch 403 or alternatively with switch 405 closed through phase shifting circuit 407 to an output 410. The first signal path, when activated by closing or activating switch 403 or integrated circuit switch, will be providing a near zero phase shift for a signal coupled through the first signal path. Further included is a second signal path coupled between the input and the output 410 via the phase shifting circuit 407 (switch 405 closed). The second path is configured for providing a second phase shift for a signal coupled through the second signal path. Basically switch 403 selects between the first path and the second path or between zero and some phase shift. Insertion loss is equalized between the first path and the second path by switching in (opening switch 405) a loss circuit, resistor 409, when the first signal path is selected. The switches 403, 405, 413, 415, 423, and 425, etc. are controlled by a control circuit, e.g., controller 125 or another controller or latch, which can alternatively be viewed as a portion of the phase shifter with selectable phase shift.

In these embodiments or other embodiments, when the switch or integrated circuit switch 403 is activated (closed or ON) thus selecting the first signal path, the resistive loss circuit or resistor 409 is switched in (switch 405 open or OFF) and is configured or value chosen to equalize the first insertion loss for the first path and the second insertion loss expected when the second signal path is selected (i.e., switch 403 is open and 405 is closed).

Various embodiments of the phase shifting circuit 407 as illustrated in FIG. 4 can further comprise a first reactance or inductor series coupled at a common node to a second reactance or inductor and a shunt circuit coupled from the common node to a reference node, e.g., a ground potential. The shunt circuit in varying embodiments further comprises a third reactance or capacitor in series with the resistive loss or resistor 409 where the switch or integrated circuit switch 405 is in parallel with the resistor 409. One embodiment uses lumped element inductors and a metal insulator metal capacitor as well as pseudo morphic high electron mobility transistors (pHEMT) for switches.

When the first switch or first integrated circuit switch 403 is closed, ON, or activated it selects the first signal path (provides a short circuit around the second signal path) and when the first switch 403 is open, OFF, or inactivated it deselects (opens) the first signal path and signal is routed via the second signal path and reactive phase shifting or changing circuit 407. When the first switch is closed 403 the second switch 405 will be open thereby adding the resistive loss circuit 409 to the reactive circuit 407. This additional loss when the first signal path is chosen can be selected, i.e., resistor value chosen, by experimental processes to equalize the insertion loss when the first signal path is selected with the insertion loss when the second signal path is selected, thereby removing any relationship between phase shift and insertion loss. Typically the resistive loss circuit or resistor will be several orders of magnitude larger than the ON resistance of an integrated circuit switch.

The first switch 403 or integrated circuit switch in series with the first signal path and the second switch 405 or integrated circuit switch for switching in the resistive loss circuit 409 are alternatively activated (when 403 is ON or CLOSED, 405 is OFF or OPEN and vice-a-versa). Similarly the phase shifting element or circuit 411 which can comprise a third switch S2*a* 413 or integrated circuit switch in series with the third signal path and a fourth switch S2*b* 415 or integrated circuit switch for the switching in a second resistive loss circuit 419, wherein the third and fourth switch or integrated circuit switch are alternatively activated (when one closed other open). In some embodiments, the first (and second) resistive loss circuit is a resistor in parallel with the second (and fourth) integrated circuit switch and the first (and second) resistive loss circuit is switched in by opening the second (and fourth) integrated circuit switch, thereby equalizing the first and second (and third and forth) insertion loss.

The control circuit is arranged to control first, second, third and fourth switches. As suggested above in some embodiments the control circuit is configured to select at least one state from available states of minimal phase shift, a first phase shift, a second phase shift, and a first plus second phase shift by activating one or more of the first, thus second, and third, thus fourth, integrated circuit switches. To select the states in order (near zero phase shift through first plus second phase shift), switches 403, 413 are ON for near zero, switches 405, 413 are ON for a first shift, switches 403, 415 are ON for a second phase shift, and switches 413, 415 are ON for a first plus second phase shift. In the above, it is understood that undesignated or unspecified switches are OFF. As suggested above, each time another switchable phase shifting element or circuit is added, e.g., 421 with switches 423, 425) the number of possible states can double and the range of phase shift for a given step size can therefore double or alternatively for a given range the resolution can double, i.e., step size can be cut in half.

The controller 125 or control circuit in addition to possibly selecting timing for activating switches and decoding inputs can, for many embodiments, by viewed as a register or buffer for storing switch state (ON or OFF) information with one output coupled to each of the switches of the variable attenuators and/or variable phase shifters. The control circuit can be programmed or loaded via inputs 133. These inputs may simply specify a state for the phase shifters and/or attenuators which are then decoded by the control circuit into switch states or the inputs can be the state for each switch or specify how much phase shift or attenuation is desired with the control circuit then determining an appropriate state. The inputs can be sent to the control circuit via the serial peripheral interface (SPI). This is a generally known serial interface as indicated above.

In other words, the attenuators 115, 121 and/or phase shifters 113, 119 are controlled using a number of switches, typically solid state or integrated switches such as those implemented as transistors. Thus, the controller 125 can be provided state information for all switches in all attenuators 115, 121 and phase shifters 113, 119, and the controller 125 essentially acts as one or more latching buffers with outputs arranged and coupled to ensure that all switches are in the appropriate ON or OFF state. Alternatively, the controller 125 can be provided an encoded value (e.g., a binary value) or two or more encoded values, wherein each of the encoded values uniquely specify a state for each attenuator 115, 121 and phase shifter 113, 119. For example, if all phase shifters 113, 119 and attenuators 115, 121 are 8 state devices, a 3 bit encoded value for each could be used to uniquely specify a particular state. Accordingly, during operation, 4 such encoded values could be provided to the controller 125 (e.g., one for each attenuator 115, 121, and one for each phase shifter 113, 119). The controller 125 may then convert each encoded value to the appropriate control signals (e.g., switch control signals) for each attenuator 115, 121 and phase shifter 113, 119, and latch in these values. In other embodiments, the amount of phase shift and attenuation for each of the four devices 113, 115, 119, 121 could be sent to the controller 125, and the controller 125 could determine the proper state to realize the desired shifts and attenuations. In another alternate embodiment, the controller 125 may receive an address or offset, and may look up the phase state and/or attenuator state information in a lookup table (not illustrated) based on the received address or offset.

Figure 6:
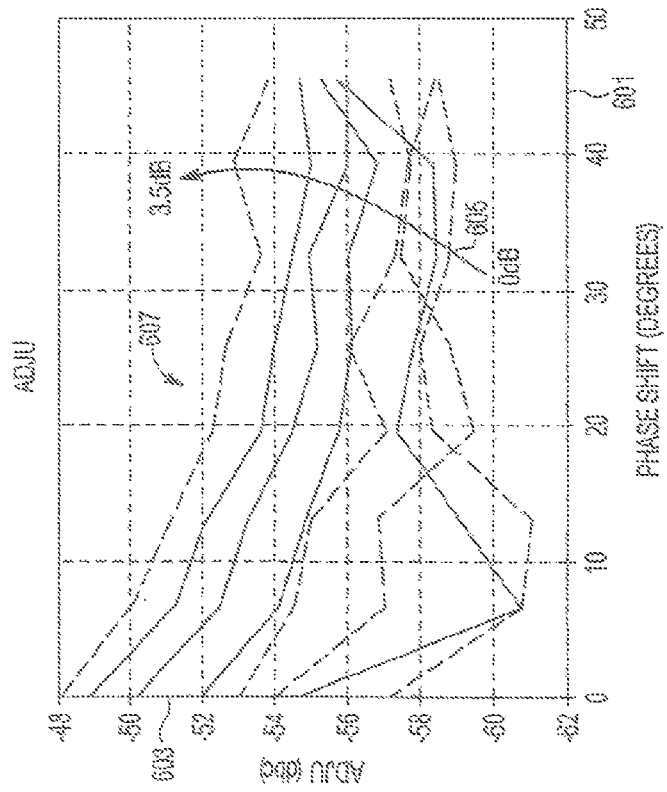
FIG. 5-8 show various performance data of one or more embodiments.
Figure 5:
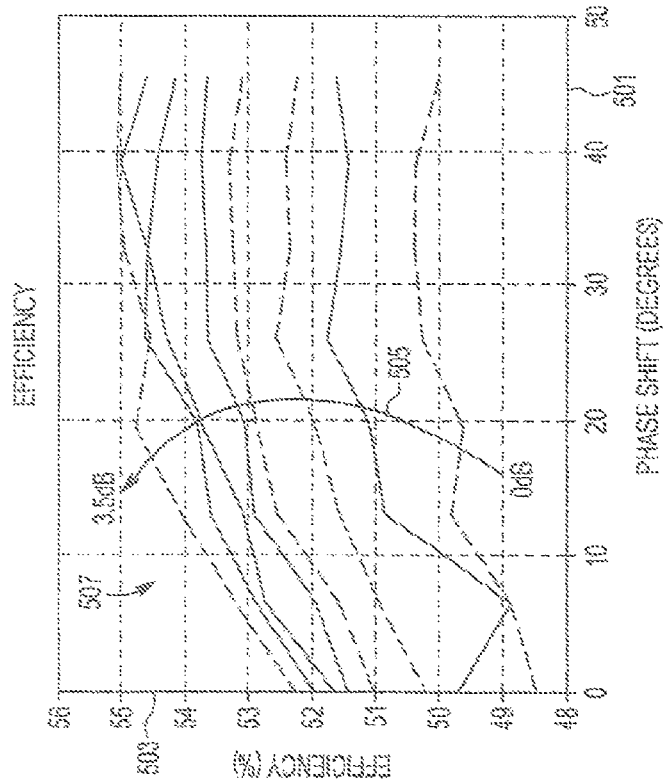

Referring to FIG. 5-8 various experimental data showing assorted performance of one or more embodiments will be discussed and described. FIG. 5-6 show efficiency and linearity as a function of phase for various attenuator settings where the data was gathered at a power output of 47 dBm from one amplifier and one set of amplifier transistors using an adjustable power splitter. FIG. 5 specifically shows phase adjustment from zero degrees to approximately 45 degrees on the horizontal axis 501 and plots efficiency percentage on the vertical axis 503 as a function of the phase variation for 8 different attenuator settings 505. These 8 settings are represented by 8 line graphs 507 which is one graph for each 0.5 dB increment in attenuator setting. As one example, at approximately 40 degrees the second line from the top, i.e., with 3 dB of attenuation, shows approximately 55% efficiency. FIG. 6 shows linearity as a function of phase adjustment or shift. The phase shift is shown on the horizontal axis 601 with linearity (adjacent channel power ratio—upper side in dB relative to the carrier) on the vertical graph 603 for 8 different attenuator settings 605. These 8 settings are represented by 8 line graphs 607 which is one graph for each 0.5 dB increment in attenuator setting. As one example, at approximately 40 degrees the second line from the top, i.e., with 3 dB of attenuation, shows approximately 55 dBc linearity. Generally, the way to use this data is select the attenuation and phase shift that provides acceptable linearity (55 dBc) and the best efficiency—in this instance approximately 55%

Figures 7, 8:
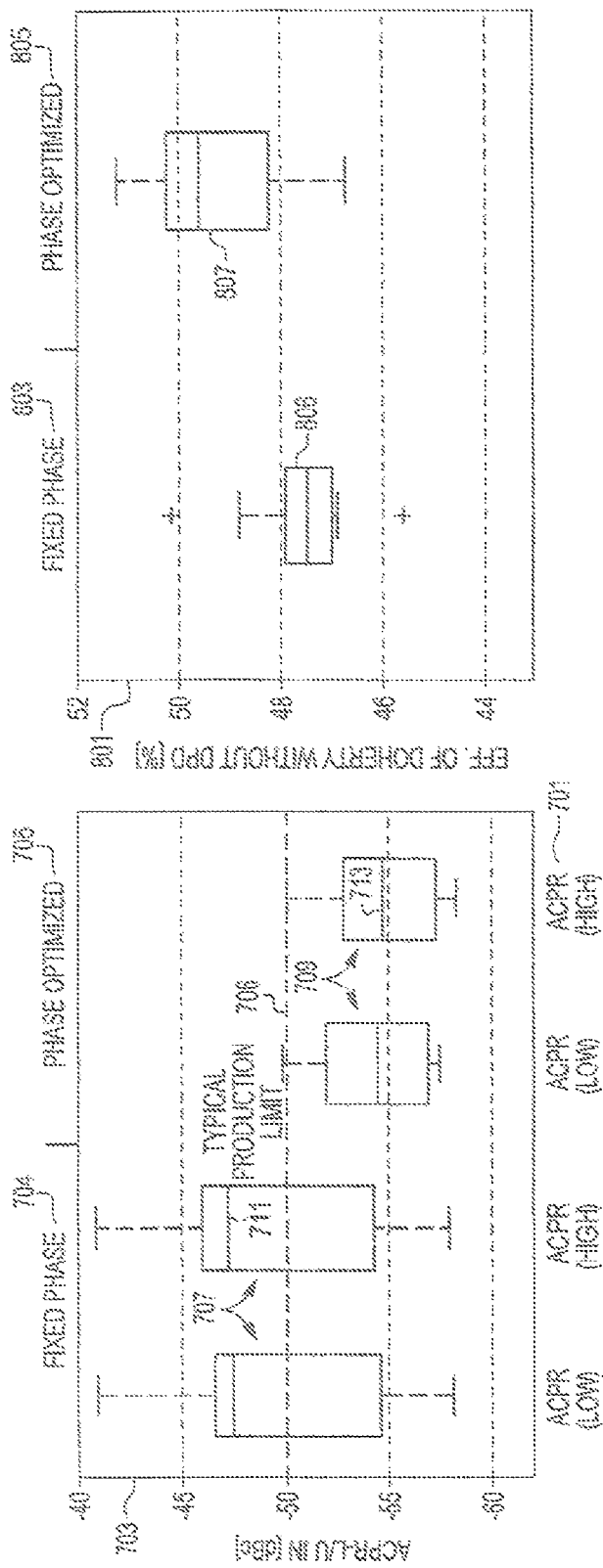

FIG. 7-8 show amplifier performance for 20 random combinations of transistors, where these transistors were selected from non average lots. The random combinations are each inserted into an amplifier fixture and measurements are taken with output power at 47 dBm. FIG. 7 specifically shows adjacent channel power ratio on the low and high side of the carrier 701 with the measured results shown on the vertical axis 703. Measurements are taken for fixed or nominal phase setting 704 and for an optimized phase setting 705. A typical production specification or limit 706 is shown. All of the measurements for all of the combinations under each condition are shown in boxes with fixed phase conditions for lower and higher side shown in boxes 707 and optimized phase conditions for lower and higher side shown in boxes 709. By observation many of the combinations were failing the production limit 706 with a fixed or nominal phase setting while all combinations were better than the limits with optimized phase settings. Furthermore, the median measurement 711 in the fixed phase case was well above the limit and toward one end of the box, whereas the median measurement 713 for the optimized phase case is well within the production limits and much closer to the center of the box. FIG. 8 shows measured % efficiencies on the vertical axis 801 for the random combinations in a Doherty amplifier using digital pre distortion (DPD) for fixed or nominal phase setting 803 and optimized phase settings 805 with measured efficiencies shown in, respective, boxes 806, 807. By observation % efficiencies have improved by 1 to 3% with an average improvement of approximately 2%.

Figure 9:
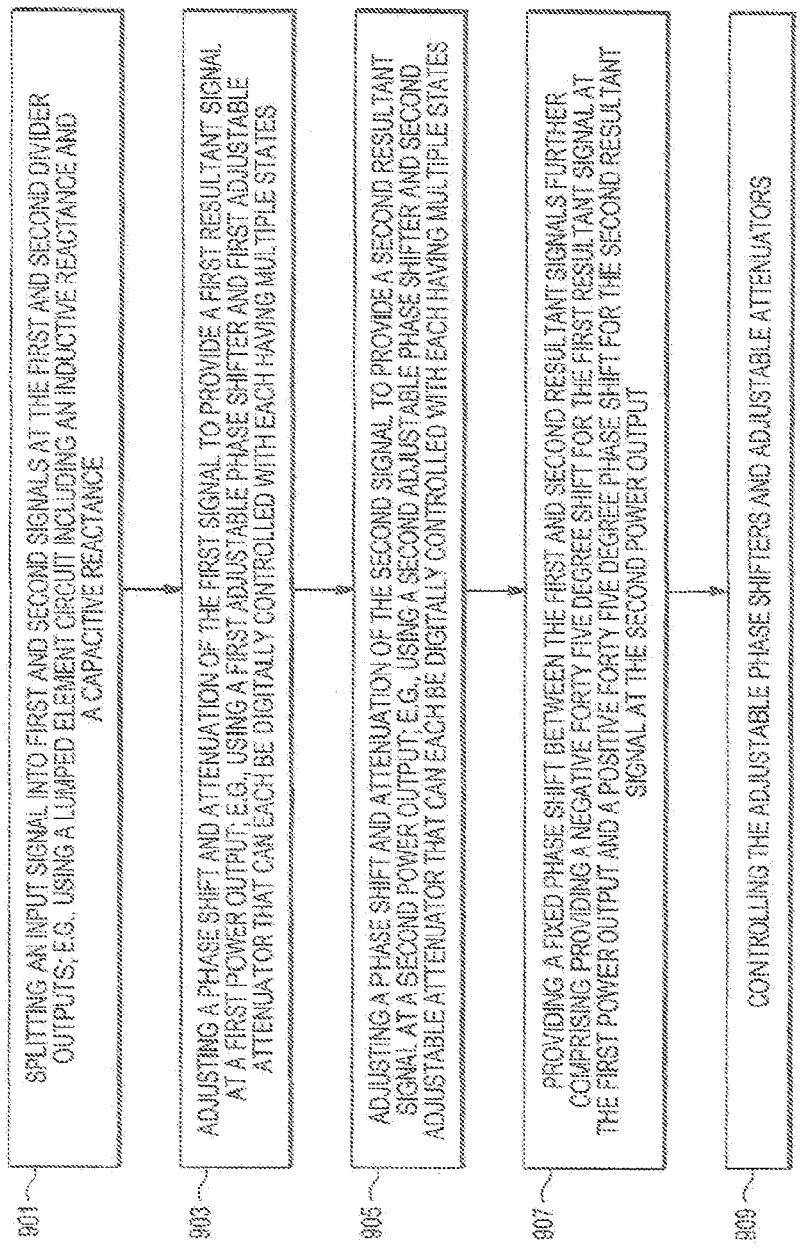
FIG. 9 shows a flow chart of a method of adjusting a power split signal that may be used in conjunction with the FIG. 1 system in accordance with one or more embodiments.

Referring to FIG. 9, a flow chart of exemplary processes included in a method of adjusting a power split signal or power splitter that can be used in conjunction with the FIG. 1 system in accordance with one or more embodiments will be discussed and described. It will be appreciated that this method uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures. It will be appreciated that the method can be performed as many times as desired or continually performed as needed.

The method of adjusting a power split signal or power splitter illustrated in FIG. 9 includes splitting 901 an input signal into a plurality, N, of signals at a plurality, N, of divider outputs (e.g., first and second signals at first and second divider outputs, or more than two signals at more than two divider outputs), where N may be any integer equal to two or more (e.g., N may be an integer in a range of 2 to 10 or more). This can include using a lumped element circuit including an inductive reactance and a capacitive reactance. This may also include providing a power divider or splitter with an input and a plurality, N, of divider outputs where the power divider is configured to split an input signal into a plurality, N, of signals at the plurality, N, of divider outputs. The providing can include providing a lumped element circuit including an inductive reactance and a capacitive reactance.

Also included in the method of FIG. 9 is adjusting 903 a phase shift and attenuation of the first signal to provide a first resultant signal at a first power output; which can include, e.g., using a first adjustable phase shifter and first adjustable attenuator that are each digitally controlled with each having multiple states. In some embodiments this may include disposing a first adjustable phase shifter and first adjustable attenuator series coupled to the first divider output and arranged and configured to phase shift and attenuate the first signal and provide a first resultant signal at a first power output. These can each be digitally controlled with each having multiple states, e.g., 8 states.

Next shown is adjusting 905 a phase shift and attenuation of the second signal to provide a second resultant signal at a second power output; which can include, e.g., using a second adjustable phase shifter and second adjustable attenuator that are each digitally controlled with each having multiple states. This can be accomplished in some instances by disposing a second adjustable phase shifter and second adjustable attenuator series coupled to the second divider output and arranged and configured to phase shift and attenuate the second signal and provide a second resultant signal at a second power output. Again, these can each be digitally controlled with each having multiple states. In embodiments in which the input signal is split into more than two signals that are provided at more than two divider outputs, and in which the adjustable phase shifter includes more than two serial coupled adjustable phase shifters and attenuators, each serial coupled phase shifter and attenuator may be digitally controlled to apply desired phase shifts and attenuations to a signal received at a divider output in order to produce a resultant signal at a power output.

In some embodiments, the method includes providing 907 a fixed phase shift between the N resultant signals (e.g., the first and second resultant signals). For example, this may comprise, e.g., providing a negative forty five degree shift for the first resultant signal at the first power output and a positive forty five degree phase shift for the second resultant signal at the second power output. Again disposing a fixed phase shifter arranged and configured to provide a fixed phase shift between signals at the N power outputs, e.g., to provide a negative forty five degree shift for the first resultant signal at the first power output and a positive forty five degree phase shift for the second resultant signal at the second power output. In most embodiments, the method includes controlling 909 the adjustable phase shifters and adjustable attenuators.

FIG. 10 depicts in a simplified and representative form of an N-way power amplifier system 1000 that includes an adjustable power splitter 1010 in accordance with one or more embodiments. In addition, system 1000 includes a front end processor module 1002, an amplifier 1033, and a signal combiner network 1050. More specifically, adjustable power splitter 1010 is coupled between front end processor 1002 and inputs to amplifier 1033, and outputs of amplifier 1033 are coupled to signal combiner network 1050 as shown in FIG. 10.

Front end processor 1002 is configured to receive an RF signal at input 1004, and to perform pre-processing on the RF signal (e.g., digital pre-distortion, filtering, and so on) before providing the processed RF signal to adjustable power splitter 1010 at RF input 1006. In addition, according to an embodiment, front end processor 1002 is also configured to provide control signals to adjustable power splitter 1010 at control input 1008. The control signals are utilized by the adjustable power splitter 1010 to adjust the attenuation and/or phase shift applied along each of N amplification paths, as will be described in more detail below. As described previously, the control signals may take the form of encoded values (e.g., values that uniquely specify a state for each attenuator 1013-1015 and phase shifter 1016-1018), unencoded values that specify the amounts of phase shift and attenuation for each attenuator 1013-1015 and phase shifter 1016-1018, or addresses or offsets that are used to determine (e.g., from a lookup table) phase shifts and attenuations for each attenuator 1013-1015 and phase shifter 1016-1018. The front end processor 1002 may determine the phase shifts and attenuations based on the characteristics of the RF signal received at input 1004 (e.g., characteristics of the signal envelope, frequency, or other characteristics), and/or characteristics of the RF signal at downstream points. For example, the system may include one or more couplers at various locations (e.g., at the outputs from adjustable power splitter 1010, at the outputs of amplifiers 1035-1037, and/or at the output from combiner network 1050), and feedback path(s) coupled to the couplers may provide feedback signals representative of the RF signals at the downstream points. The front end processor 1002 may analyze the feedback signals and may determine desired phase shifts and/or attenuation levels that ultimately may improve the quality of the amplified RF signal (e.g., the signal provided to the load).

The adjustable power splitter 1010 includes a power divider 1012 with an input and N divider outputs 1020-1022. The power divider 1012 operates to divide or split a signal at the input 1006 into N signals, which may be identical or very nearly identical signals with, in some embodiments, substantially equal power. Power divider 1012 may be a 3 dB divider or another type of divider that produces equal or unequal power signals. Some embodiments of the adjustable power splitter 1010 further include one or more fixed phase shifters (not illustrated, but similar in nature to phase shifters 129, 131, FIG. 1) that are configured for adding a fixed phase shift to the signals at the N power outputs 1020-1022.

The adjustable power splitter 1010 also includes N adjustable phase shifters 1016-1018 and N adjustable attenuators 1013-1015, which are series coupled between the N divider outputs 1020-1022 and N power outputs 1030-1032. It will be appreciated that the adjustable phase shifters and adjustable attenuators can be series coupled to each other in any order (i.e., phase shifter followed by attenuator as shown or vice versa). In alternate embodiments, an adjustable power splitter may include only adjustable attenuators 1013-1015 or only adjustable phase shifters 1016-1018, but not both. In still other alternate embodiments, one or more of the paths may exclude the adjustable phase shifter and/or adjustable attenuator.

In various embodiments of the adjustable power splitter 1010, the N adjustable phase shifters 1016-1018 and the N adjustable attenuators 1013-1015 are each digitally controlled (e.g., by controller 1026) and have a plurality of states. In one or more embodiments, the N adjustable phase shifters 1016-1018 each have eight phase shifted states. It will be appreciated that the phase shifters may have different numbers of phase shifted states, cover different ranges, and have different steps sizes, although they may be essentially the same.

In various embodiments of the adjustable power splitter 1010, the N adjustable attenuators 1013-1015 also are each digitally controlled (e.g., by controller 1026) and have a plurality of states. In one or more embodiments, the N adjustable attenuators 1013-1015 each have eight attenuation states or attenuation levels. It will be appreciated that the attenuators may have different numbers of attenuation states, cover different attenuation ranges, and have different attenuation steps sizes, although they may be essentially the same.

As mentioned above, the adjustable power splitter 1010 also includes the controller 1026 which is configured and arranged to control or for controlling the adjustable phase shifters 1016-1018 and adjustable attenuators 1013-1015. External circuitry (e.g., front end processor 1002) may communicate with the controller 1026 via an interface (not illustrated), such as a serial interface (e.g., a SPI or other interface). As discussed previously in conjunction with FIG. 1, various approaches and variants or combinations of those approaches can be utilized by the controller 1026 to control the adjustable phase shifters 1016-1018 and adjustable attenuators 1013-1015. Generally as previously explained, control of the adjustable phase shifters 1016-1018 and adjustable attenuators 1013-1015 includes controlling switches of the adjustable phase shifters 1016-1018 and adjustable attenuators 1013-1015 (e.g., as described in conjunction with FIGS. 3 and 4) using switch control signals 1027. For ease of illustration, only two of switch control signals 1027 are shown to be coupled with phase shifter 1018 and attenuator 1015, but the other switch control signals 1027 also would be coupled with the other phase shifters 1016, 1017 and attenuators 1013, 1014.

The N power outputs 1030-1032 of the adjustable power splitter 1010 are coupled to N inputs of the N-way power amplifier 1033. According to an embodiment, power amplifier 1033 may be a Doherty amplifier with a main amplifier 1035 and two or more peaking amplifiers 1036, 1037. Alternatively, power amplifier 1033 may be another type of amplifier, as discussed previously.

A matching network or circuit (not illustrated, but similar in nature to matching circuits 135, 139, FIG. 1) may be coupled between each power output 1030-1032 and each amplifier 1035-1037. Each of the amplifiers 1035-1037 may be comprised of one or more stages of low level amplification and higher level amplification. The amplifiers 1035-1037 may be coupled via output matching circuits (not illustrated, but similar in nature to matching circuits 143, 145, FIG. 1) to combiner network 1050. The combiner network 1050 functions to combine the signals produced by each of the amplifiers 1035-1037 in order to produce a combined, amplified RF signal at output 1052. The combiner network 1050 may include one or more phase delay elements (not illustrated), which function to ensure that the signals produced by each of the amplifiers 1035-1037 are combined in phase. The amplified RF signal may then be applied to a load 1056 through an impedance transformation circuit 1054.

In previously discussed embodiments, a plurality, N, of series coupled signal adjustment circuits (each including an adjustable phase shifter and an adjustable attenuator coupled between and input node and an output node) are coupled to a plurality, N, of amplifiers. More specifically, each amplifier is coupled in series with one of the series coupled signal adjustment circuits. In the embodiments illustrated in FIGS. 1 and 10, the output node of each series coupled signal adjustment circuit is coupled with an input to an amplifier. In alternate embodiments, such as the power amplifier system 1100 illustrated in FIG. 11, the input node 1120, 1128, 1122 of each series coupled signal adjustment circuit may instead be coupled with an output from an amplifier 1135, 1136, 1137. In such a configuration, each series coupled signal adjustment circuit would be able to adjust the amplitude and/or phase of an amplified signal that is output from its respective amplifier 1135, 1136, 1137. As with the previously described adjustable phase shifters and attenuators, the adjustable phase shifters 1116, 1117, 1118 and adjustable attenuators 1113, 1114, 1115 of such an embodiment may be digitally controlled (e.g., by a controller 1126 such as controller 125 or 1025, FIGS. 1, 10).

It will be appreciated that the above described functions and adjustable signal or power splitters may be implemented with one or more integrated circuits or hybrid structures or combinations or the like. The processes, apparatus, and systems, discussed above, and the inventive principles thereof are intended to and can alleviate yield and performance issues caused by prior art techniques. Using these principles of independent adjustment of phase or signal level or signal attenuation within a power splitter can quickly resolve performance and production yield problems in, e.g., Doherty amplifiers with relatively minor costs and the like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An adjustable radio frequency (RF) power splitter comprising:
   a plurality, N, of series coupled adjustable phase shifters and adjustable attenuators configured to phase shift and attenuate RF signals, wherein each series coupled adjustable phase shifter and adjustable attenuator is coupled between one of a plurality, N, of power divider outputs and one of a plurality, N, of power outputs; and
   each of the N power outputs coupled to one of a plurality, N, of inputs to an N-way Doherty power amplifier.

2. The adjustable RF power splitter of claim 1 wherein the adjustable phase shifters are digitally controlled and each of the adjustable phase shifters has a plurality of states.

3. The adjustable RF power splitter of claim 1 wherein the adjustable attenuators are digitally controlled and each adjustable attenuator has a plurality of states.

4. The adjustable RF power splitter of claim 1 further including a power divider with an input and the plurality, N, of divider outputs.

5. The adjustable RF power splitter of claim 4 wherein the power divider is a lumped element circuit including an inductive reactance and a capacitive reactance.

6. An adjustable radio frequency (RF) power splitter comprising:
   a plurality, N, of series coupled adjustable phase shifters and adjustable attenuators configured to phase shift and attenuate RF signals, wherein each series coupled adjustable phase shifter and adjustable attenuator is coupled between one of a plurality, N, of power divider outputs and one of a plurality, N, of power outputs;
   each of the N power outputs coupled to one of a plurality, N, of inputs to an N-way amplifier; and
   one or more fixed phase shifters configured for adding one or more fixed phase shifts to signals at the N power outputs.

7. An adjustable radio frequency (RF) power splitter comprising:
   a plurality, N, of series coupled adjustable phase shifters and adjustable attenuators, wherein each series coupled adjustable phase shifter and adjustable attenuator is coupled between one of a plurality, N, of power divider outputs and one of a plurality, N, of power outputs;
   each of the N power outputs coupled to one of a plurality, N, of inputs to an N-way amplifier; and
   one or more fixed phase shifters configured for adding one or more fixed phase shifts to signals at the N power outputs, wherein a first fixed phase shifter is configured to add a negative forty five degree shift to a first signal at a first power output, and a second phase shifter is configured to add a positive forty five degree phase shift to a second signal at a second power output.

8. An adjustable radio frequency (RF) power splitter comprising:
   a plurality, N, of series coupled adjustable phase shifters and adjustable attenuators, wherein each series coupled adjustable phase shifter and adjustable attenuator is coupled between one of a plurality, N, of power divider outputs and one of a plurality, N, of power outputs;
   each of the N power outputs coupled to one of a plurality, N, of inputs to an N-way amplifier; and
   one or more fixed phase shifters configured for adding one or more fixed phase shifts to signals at the N power outputs, wherein the one or more fixed phase shifters each include a lumped element circuit having an inductive reactance and a capacitive reactance.

9. The adjustable RF power splitter of claim 1 further comprising a controller for controlling the adjustable phase shifters and the adjustable attenuators.

10. An amplifier system comprising:
    a plurality, N, of series coupled adjustable phase shifters and adjustable attenuators configured to phase shift and attenuate RF signals, wherein each series coupled adjustable phase shifter and adjustable attenuator is coupled between one of a plurality, N, of power divider outputs and one of a plurality, N, of power outputs; and a radio frequency, N-way Doherty power amplifier with a main amplifier coupled to a first power output and two or more peaking amplifiers coupled to two or more other power outputs.

11. The amplifier system of claim 10 wherein the adjustable phase shifters and the adjustable attenuators are digitally controlled with each having multiple states.

12. The amplifier system of claim 10 further including a power divider with an input and the plurality, N, of divider outputs.

13. The amplifier system of claim 12, wherein the power divider is a lumped element circuit including an inductive reactance and a capacitive reactance.

14. The amplifier system of claim 10 further including a first lumped element phase shifter configured to provide a first phase shift to a first signal at a first power output, and a second lumped element phase shifter configured to provide a second and different phase shift to a second signal at a second power output.

15. The amplifier system of claim 10 further comprising a controller for controlling the adjustable phase shifters and adjustable attenuators.

16. An amplifier system comprising:
a plurality, N, of series coupled signal adjustment circuits, wherein each signal adjustment circuit includes an adjustable phase shifter and an adjustable attenuator configured to phase shift and attenuate RF signals; and
a plurality, N, of amplifiers, wherein each amplifier is coupled in series with one of the series coupled signal adjustment circuits, and the plurality of amplifiers forms a portion of an N-way Doherty power amplifier.

17. The amplifier system of claim 16, wherein each signal adjustment circuit is coupled between an input node and an output node, and each amplifier includes an input coupled to an output node of one of the series coupled signal adjustment circuits.

18. An amplifier system comprising:
a plurality, N, of series coupled signal adjustment circuits, wherein each signal adjustment circuit includes an adjustable phase shifter and an adjustable attenuator configured to phase shift and attenuate RF signals; and
a plurality, N, of amplifiers, wherein each amplifier is coupled in series with one of the series coupled signal adjustment circuits, wherein each signal adjustment circuit is coupled between an input node and an output node, and each amplifier includes an output coupled to an input node of one of the series coupled signal adjustment circuits.

19. A method of adjusting a power split signal comprising:
splitting an input signal into a plurality, N, of radio frequency (RF) signals at a plurality, N, of divider outputs;
adjusting phase shifts and attenuations of at least some of the plurality of RF signals to provide a plurality, N, of resultant RF signals at a plurality, N, of power outputs; and
providing the plurality of resultant RF signals to an N-way Doherty power amplifier.

20. The method of adjusting a power split signal of claim 19 wherein the adjusting the phase shifts and attenuations of at least some of the plurality of RF signals further comprises using an adjustable phase shifter and an adjustable attenuator to adjust each of the at least some of the plurality of RF signals, wherein the adjustable phase shifter and the adjustable attenuator each are digitally controlled and each have multiple states.

21. The amplifier system of claim 10, wherein N equals 2.

22. The amplifier system of claim 10, wherein N is greater than 2.

23. The method of adjusting a power split signal of claim 19, wherein N equals 2.

24. The method of adjusting a power split signal of claim 19, wherein N is greater than 2.

* * * * *